United States Patent [19]

Nishizawa et al.

[11] Patent Number: 5,663,582
[45] Date of Patent: Sep. 2, 1997

[54] HIGH FREQUENCY STATIC INDUCTION TRANSISTOR HAVING HIGH OUTPUT

[75] Inventors: Junichi Nishizawa; Kaoru Motoya; Akira Ito, all of Miyagi, Japan

[73] Assignee: Zaidan Hojin Handotai Kenkyu Shinkokai, Miyagi, Japan

[21] Appl. No.: 651,851

[22] Filed: May 21, 1996

[30] Foreign Application Priority Data

May 22, 1995 [JP] Japan .................. 7-145178
May 22, 1995 [JP] Japan .................. 7-145179

[51] Int. Cl.$^6$ .................. H01L 29/74; H01L 31/111
[52] U.S. Cl. .................. 257/136; 257/135; 257/264; 257/266; 257/474
[58] Field of Search .................. 257/135, 136, 257/264, 266, 494

[56] References Cited

U.S. PATENT DOCUMENTS 4,504,847  3/1985  Nishizawa .
5,323,029  6/1994  Nishizawa .................. 257/136
5,426,314  6/1995  Nishizawa et al. .................. 257/136

*Primary Examiner*—Ngân V. Ngô
*Attorney, Agent, or Firm*—Sughrue, Mion, Zinn, Macpeak & Seas

[57] ABSTRACT

A recess-gate type static induction transistor having a high breakdown voltage is provided, which includes an n-type channel region provided over an n$^+$-type drain region, p$^+$-type elongated gate regions provided in grooves of the channel region, n$^+$-type elongated regions formed on the channel region so as to be arranged in parallel with the gate regions, each of which is disposed between the gate regions, and a p$^+$-type guard ring region provided in the channel region and arranged to surround the gate regions. The elongated gate regions are coupled to the guard ring region at both edges. In addition, the outer-most elongated gate regions are coupled to the guard ring region along the longitudinal direction, respectively, thereby increasing the breakdown voltage of the device. Further, gate and source contact pads are provided only on the guard ring region so as to be opposed, thereby reducing unwanted parasitic capacitances between gate and drain regions and between gate and source regions.

14 Claims, 13 Drawing Sheets

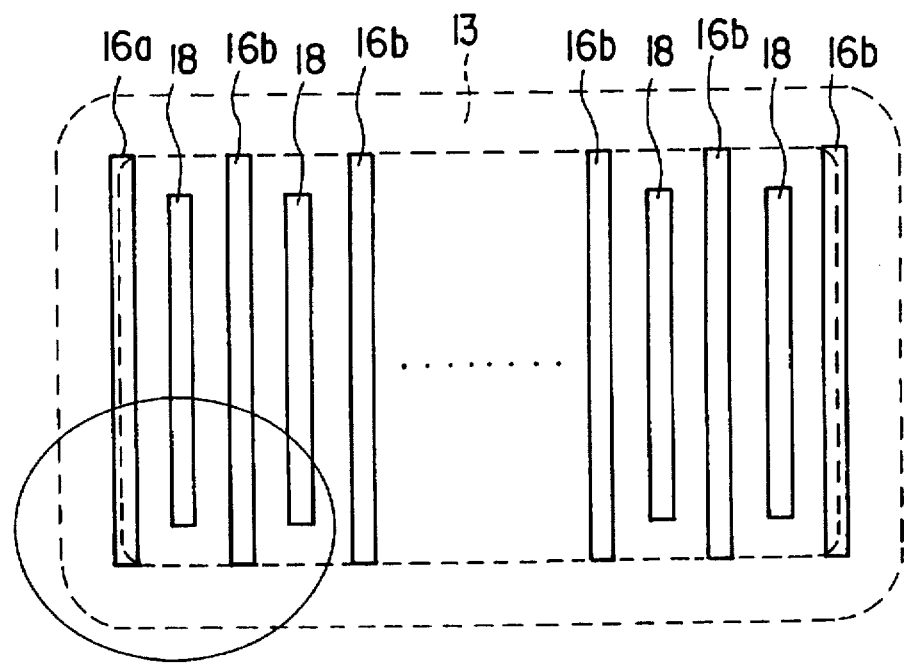
F I G. I A
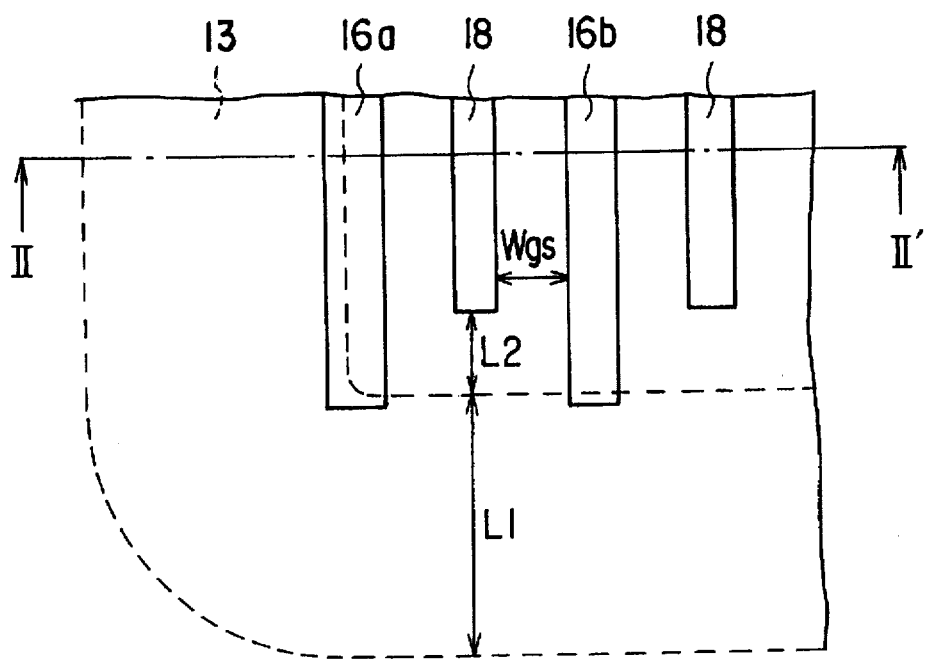
F I G. I B

HIGH FREQUENCY STATIC INDUCTION TRANSISTOR HAVING HIGH OUTPUT

BACKGROUND OF THE INVENTION

1. Field of the Invention

The present invention relates to a static induction transistor (SIT) and in particular to a high-frequency recess gate type or side gate type static induction transistor having high output power.

2. Description of the Related Art

An SIT according to a related art will be described with reference to FIG. 20. FIG. 20 (A) shows a surface gate type SIT, which includes an n$^+$ substrate 101 serving as a drain region, an n epitaxial layer 102 serving as a channel region provided over the substrate 101, an n$^+$ source region 103 and a p$^+$ gate region 104 that are formed on the surface of the n epitaxial layer 102. According to such a surface gate structure, a gate resistance is reduced to improve the high-frequency characteristics. The surface gate type SIT operating at up to about 1 GHz has been provided. Since the p$^+$ gate region 104 having the diffusion depth of 2-3 μm or more is provided, the breakdown voltage having 200–300 V can be obtained when the thickness of the n epitaxial layer 102 is 20 μm, and similarly the breakdown voltage having 600 V can be provided when the thickness of the n epitaxial layer 102 is 6 μm.

A recess gate type SIT and a side gate type SIT shown in FIGS. 20 (B) and (C) have been proposed as structures for furthermore improving the high-frequency characteristics. In the recess gate type SIT, a groove 105 is formed in the n epitaxial layer 102, and a p$^+$ gate region 106 is provided on a bottom of the groove 105. In the side gate type SIT, a p$^+$ gate region 108 is formed in both corners of a groove 107 made in the n epitaxial layer 102. Since these SITs have reduced gate-source capacitance $C_{gs}$ and gate-drain capacitance $C_{gd}$ as compared with the surface gate type SIT, the power gain can be increased to almost the upper limit of the UHF band. If the n epitaxial layer 102 is about 6–10 μm thick, for example, in the recess gate type SIT, the power gain at 1-3 GHz is 7–10 dB and a device operable at several GHz as the maximum oscillation frequency $f_{max}$ at which the gain becomes 1 (0 dB) can be provided.

To enhance the high-frequency characteristics, the gate-source capacitance $C_{gs}$ and gate-drain capacitance $C_{gd}$ may be reduced. For reducing $C_{gd}$, the diffusion depth Xj of the p$^+$ gate region 106 may be made shallow. Since $C_{gd}$ increases inversely with the distance between the gate region and the drain region, the n epitaxial layer 102 may be made thick to reduce $C_{gd}$. However, if the n epitaxial layer 102 is made thick, the gain is reduced due to the transit time effect produced by the fact that electrons flow from the source region to the drain region. Therefore, $C_{gd}$ and $f_{max}$ have a trade-off relation with respect to the thickness of the n epitaxial layer 102.

In order to increase gate-to-drain breakdown voltage $BV_{gd}$, Xj may be increased. However, the distance between the gate region and the drain region is decreased to increase $C_{gd}$. That is, $BV_{gd}$ and $C_{gd}$ have a trade-off relation with respect to the diffusion thickness Xj of the p$^+$ gate region 106. As described above, the high-frequency characteristics are strongly concerned with the breakdown voltage. $BV_{gd}$ is a reverse breakdown voltage of a pn junction between the gate and drain regions, thereby determining the maximum voltage (breakdown voltage) applicable to the drain region.

By the way, the actual $BV_{gd}$ of the recess gate type SIT is lower than the theoretical breakdown voltage determined by a flat junction portion. Applying a voltage to the pn junction between the gate and drain regions until the breakdown voltage, the surface of the SIT was then observed by an infrared radiation microscope. It was found that a temperature rise occurs at the outermost peripheral portion of the p$^+$ gate region 106, whereby the breakdown voltage is lowered at a spherical or cylindrical junction portion produced at the outermost peripheral portion rather than the flat junction portion (the portion at which theoretical breakdown voltage is obtained) between the gate and drain regions.

Since the output power in the SITs is increased in proportion to the product of drain voltage and drain current, it is optimum design to provide the theoretical breakdown voltage determined by the thickness between the gate and drain regions without lowering the high-frequency characteristics in order to realize high frequency and large output power devices. However, the actual $BV_{gd}$ is lower than the theoretical breakdown voltage and, therefore, it is necessary to increase the $BV_{gd}$ to the theoretical breakdown voltage in order to provide the high frequency and large output power recess gate type SIT. The same statement is true for the side gate type SIT.

Next, the structure of the gate and the source electrodes in the SITs will be schematically described with reference to FIG. 21 (A). P$^+$ gate and n$^+$ source regions are disposed in parallel within a region enclosed with a broken line (element portion 120), and gate electrodes 108 and source electrodes 109 are provided on the p$^+$ gate and n$^+$ source regions, respectively. An aluminum (Al) gate contact pad 110 and an aluminum (Al) surface contact pad 111 are formed on regions outside the element portion 120. Right-upward oblique lines are indicatively drawn in a connection portion 112 between the gate contact pad 110 and each of the gate electrodes 108, and left-downward oblique lines are drawn in a connection portion 113 between the source contact pad 111 and each of source electrodes 109. As shown in FIG. 21 (B), the gate contact pad 110 is provided on an oxide film 114 formed on the n epitaxial layer 102. Likewise, although not shown, the source contact pad 111 is also formed on the oxide film 114. In such a pad structure, the breakdown voltage between the gate and drain regions is about 200–300 V although it depends on the thickness and quality of the oxide film underlying each Al pad.

Further, an SIT is constituted by one element portion. Since the drain current is proportional to the total source length, the area of the element portion 120 may be increased to increase the total source length in order to increase the drain current. However, resistance and inductance of the source and gate regions are increased as the area of element portion 120 is increased; particularly when the SIT is used in a microwave band, the operating conditions of the device will be greatly affected by the resistance and inductance. Therefore, there is a limit for increasing the area of the element portion.

SUMMARY OF THE INVENTION

Therefore, it is an object of the invention to provide a recess gate or side gate type SIT having a gate-drain junction of high breakdown voltage and improved high frequency characteristics.

It is another object of the invention to provide a high frequency recess gate or side gate type SIT having a large output power characteristics.

It is a still another object of the invention to provide a recess gate or side gate type SIT having reduced gate-to-drain and gate-to-source parasitic capacitances.

It is another object of the invention to provide a recess gate or side gate type SIT capable of allowing a large current to flow and having a reduced inductance.

These objects and advantages of the present invention can be achieved by following structures.

According to one aspect of the present invention, there is provided a recess-gate or side-gate type static induction transistor which comprises a drain region having a first conductivity type, a channel region, provided over the drain region, having the first conductivity type, a plurality of grooves each being formed in the channel region, a plurality of source regions having the first conductivity type, each being provided on the channel region so as to be disposed between the grooves, a plurality of gate regions having a second conductivity type, each being provided in the bottom of each groove, the gate and source regions being arranged in parallel to one another, and a guard ring region having the second conductivity type and being provided in the channel region so as to surround the gate regions. In such a structure, the guard ring region is arranged so that the outer-most gate regions overlap one side of the guard ring region in the longitudinal direction, respectively, and that each of the gate regions is coupled to the guard ring region at both edges thereof.

According to another aspect of the present invention, gate and source electrode pads are provided only on the guard ring region so as to be opposed to each other.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1A is a plan view schematically showing a first embodiment of an SIT according to the invention;

FIG. 1B is a partially enlarged view of a portion of FIG. 1(A) surrounded by a circle;

DESCRIPTION OF THE PREFERRED EMBODIMENTS

Figure 2:
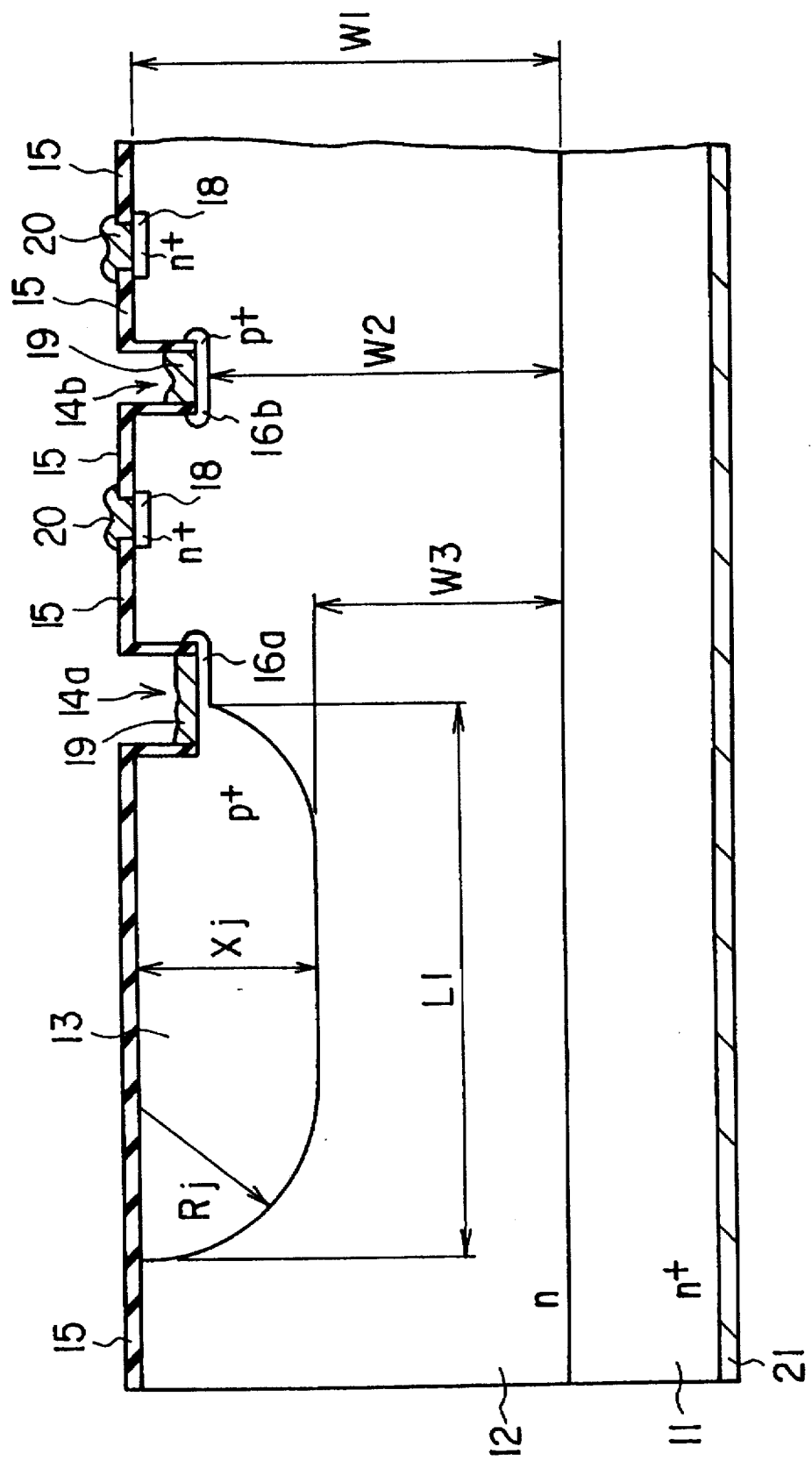
FIG. 2 is a sectional view of FIG. 1(B) taken along a line II–II'.

Embodiments according to the invention will be described with the accompanying drawings.

A first embodiment of the invention will be described.

As shown in FIG. 1 (A), a recess gate type SIT includes a plurality of elongated $p^+$ gate regions 16 (containing 16a and 16b), a plurality of elongated $n^+$ source regions 18, and a band-like $p^+$ guard ring region 13 placed so as to surround the $p^+$ gate regions 16 (portion enclosed with a broken line). The $p^+$ gate regions 16 and the $n^+$ source regions 18 are disposed so as to be substantially perpendicular to the long sides of the $p^+$ guard ring region 13 and further are alternately located in parallel with the short sides of the $p^+$ guard ring region 13.

As shown in FIG. 1 (B), the $p^+$ gate region 16a disposed on the outermost (leftmost) side is connected to the $p^+$ guard ring region 13 along the longitudinal direction and each $p^+$ gate region 16b sandwiched between the $n^+$ source regions 18 is connected to the $p^+$ guard ring region 13 at one edge or end. The corners of the $p^+$ guard ring region 13 are rounded so as to relieve an electric field intensity. Further, to prevent gate-to-source breakdown voltage BVgs from lowering, it is desirable that each of the $n^+$ source regions 18 are provided to satisfy L2≧Wgs. In the figure, L1 denotes the width of the $p^+$ guard ring region 13, L2 denotes the distance between the edge of the $n^+$ source regions 18 and the $p^+$ guard ring region 13, and Wgs denotes the distance between the $n^+$ source regions 18 and the $p^+$ gate region 16.

Further, the recess gate type SIT will be described in more detail with reference to FIG. 2, which is a sectional view taken along a line II–II' in FIG. 1 (B). The recess gate type SIT includes an $n^+$ drain region ($n^+$ substrate) 11, an n epitaxial layer 12, which is a high-resistance channel region provided over the $n^+$ drain region 11, grooves 14a and 14b formed in the n epitaxial layer 12, an insulating film 15 formed on the n epitaxial layer 12, $p^+$ gate regions 16a and 16b formed on the bottoms of the grooves 14a and 14b, a $p^+$ guard ring region 13 formed in the n epitaxial layer 12 so as to be connected along the outer peripheral portion of the $p^+$ gate region 16a, $n^+$ source regions 18 provided on the n epitaxial layer 12, gate electrodes 19 and source electrodes 20 disposed on the $p^+$ gate regions 16 and the $n^+$ source regions 18, respectively, and a drain electrode 21 provided over the $n^+$ drain region 11. An $SiO_2$ film, an SiN film, a PSG film, or these composite films can be used as the insulating film 15.

In FIG. 2, W1 denotes the thickness of the n epitaxial layer 12, W2 denotes the distance between the $p^+$ gate region 16 and the $n^+$ drain region 11, W3 denotes the distance between the $p^+$ guard ring region 13 and the $n^+$ drain region 11. Xj denotes the diffusion depth of the p$^+$ guard ring region 13, and Rj denotes the curvature radius of the p$^+$ guard ring region 13. Rj is about 80% of Xj.

For example, assume that W1 is 9 μm, that the depth of the groove 14 is 1–1.5 μm, and that the diffusion depth of the p$^+$ gate region 16 is about 0.5 μm. For a conventional device having no p$^+$ guard ring region, BV$_{gd}$ is about 50–60 V. In contrast, for the device of the invention provided with the p$^+$ guard ring region 13 having L1 of 8–13 μm and Xj of about 2 μm, BV$_{gd}$ becomes 120–140 V; a value of about twice or more that of the conventional device is provided.

In the above-described structure, W2 is about 7 μm considering the transition region between the n$^+$ drain region 11 and the n epitaxial layer 12. In this case, the theoretical breakdown voltage is determined by the flat junction portion of the p$^+$ gate region 16 and is about 156 V. The structure having the p$^+$ guard ring region 13 according to the invention would be able to provide a value close to 90% of the theoretical value.

Next, the width L1 of the p$^+$ guard ring region 13 will be described. In the SIT provided with the p$^+$ guard ring region 13, a parasitic capacitance C$_{gd}$' occurs between the p$^+$ guard ring region 13 and the n$^+$ drain region 11. Unless C$_{gd}$' is sufficiently low with respect to C$_{gd}$ formed between the p$^+$ gate region 16 and the n$^+$ drain region 11, the high-frequency characteristics will be lowered, thereby reducing the power gain. Therefore, it is necessary to decrease C$_{gd}$'. L1 may be then reduced as much as possible. However, if L1 is too short, the breakdown voltage BV$_{gd}$ is lowered because it is determined by the cylindrical junction portion provided in the periphery of the p$^+$ guard ring region 13. Therefore, it is necessary to determine the width L1 of the p$^+$ guard ring region 13 by the relationship between L1 and BV$_{gd}$.

The impurity concentration of the guard ring region 13 may be equal to or less than that of the p$^+$ gate regions 16a, 16b. If the impurity concentration of the guard ring region 13 is less than that of the p$^+$ gate regions 16a, 16b, the depletion layer extends also to the p$^+$ guard ring region 13 further to increase the breakdown voltage and to reduce the parasitic capacitance.

Although the gate and source contact pads are not shown in FIG. 1 (A), a gate contact pad connected to one edge of a plurality of elongated p$^+$ gate regions 16 and a source contact pad connected to one edge of a plurality of elongated n$^+$ source regions 18 are provided on the n epitaxial layer 12 having the p$^+$ guard ring region 13 by the insulating film so that they are opposed to each other.

Figure 3:
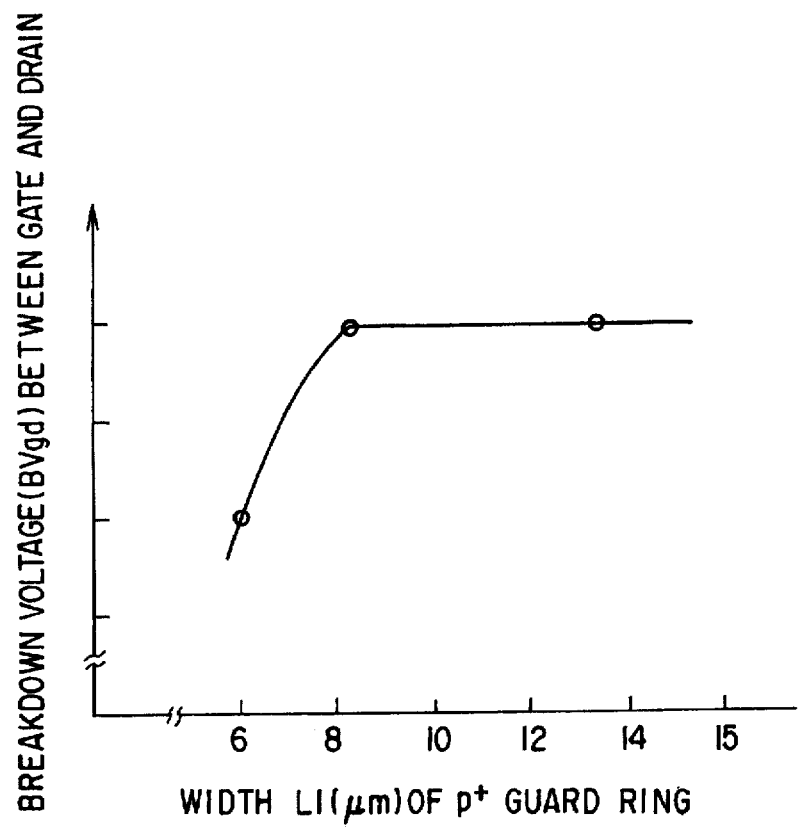
FIG. 3 is a graph showing a relation between a width L1 and a breakdown voltage $BV_{gd}$ between a gate region and a drain region.

FIG. 3 shows the relationship between the p$^+$ guard ring width L1 and the gate-to-drain breakdown voltage BV$_{gd}$ in the SIT having W1 9 μm, the depth of the groove 14 set to 1–1.5 μm, the diffusion depth of the p$^+$ gate region 16 set to about 0.5 μm, and Xj set to 2 μm. According to the FIG. 3, BV$_{gd}$ is saturated when L1 is about 8 μm or more. When L1 is 8 μm or more, a depletion layer extends to the drain region 11 and exceeds the distance W2 (about 7–7.5 μm) from the p$^+$ gate region 16 to the n$^+$ drain region 11, whereby the electric field intensity at the surface is relieved. This means that the breakdown voltage BV$_{gd}$ is determined by the flat junction portion of the p$^+$ gate region 16 within the device. Therefore, for obtaining predetermined breakdown voltage and for reducing the parasitic capacitance C$_{gd}$' at the same time, it is desired that the width L1 of the p$^+$ guard ring 13 is almost equal to or slightly more than W2.

Figure 4:
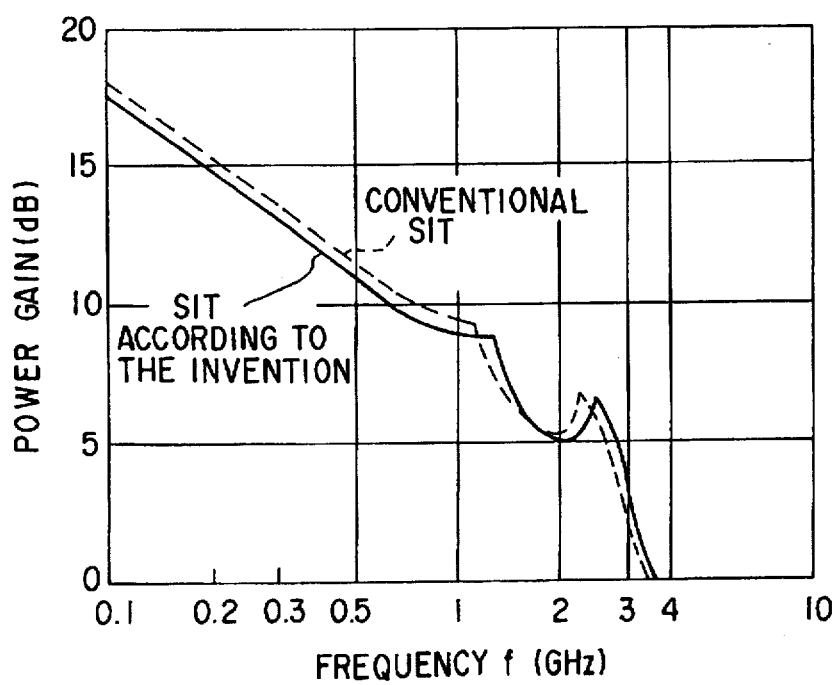
FIG. 4 is a graph showing frequency characteristics of power gain in the SITs.

FIG. 4 shows the relationship between the power gain and the frequency calculated by measuring S parameter of the recess gate type SIT with 100 elongated source regions connected in parallel (each source length: 120 nm, total source length: 1.2 cm). The SIT of the invention with L1 set to about 8 μm is shown in comparison with the conventional SIT having no guard ring structure. The bias conditions are as follows: (Since the SIT of the invention having the p$^+$ guard ring has large BV$_{gd}$, Vds is set to 50 V that is doubled as compared with the conventional SIT.)

| Bias conditions | Vds (V) | Id (mA) | Vgs (V) |
|---|---|---|---|
| SIT of the invention | 50 | 50 | −3.17 |
| Conventional SIT | 25 | 50 | −4.45 |

As shown in FIG. 4, with regard to the maximum stable gain, it is reduced by about 0.5 dB in the SIT of the invention due to C$_{gd}$'. With regard to the maximum available gain, however, the SIT of the invention has a power gain almost equal to that of the conventional SIT and also more than the conventional SIT at some frequencies because of affection of the inductance, in addition to C$_{gd}$ and C$_{gd}$'. The breakdown voltage of the SIT according to the invention can be increased to two or more times as high as that of conventional SIT without degrading the frequency characteristics. This means that the allowed DC input to the SIT can be doubled, thereby doubling the output power of the invention as compared to an SIT having the same source length.

Figure 5:
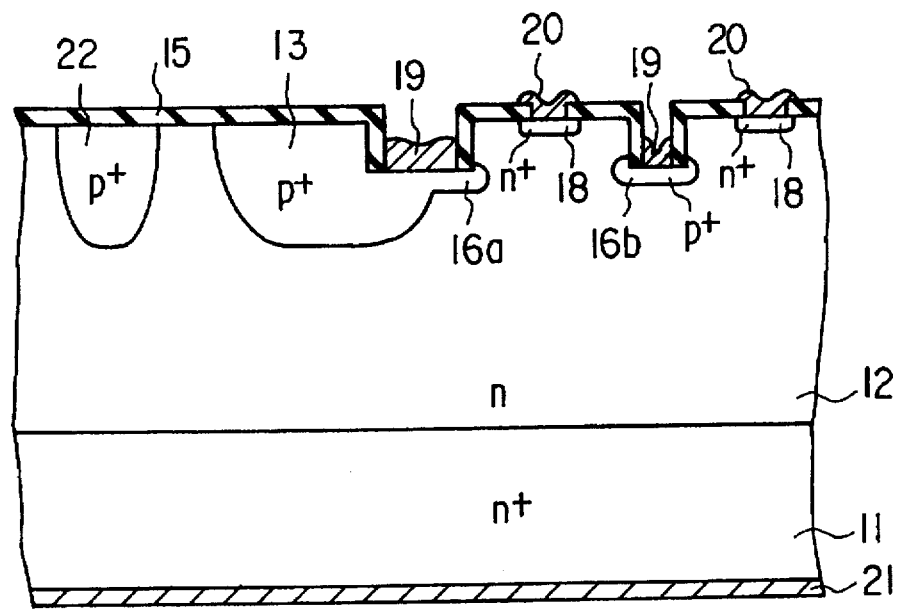
FIG. 5 is a sectional view schematically showing a second embodiment of the SIT according to the invention.

Next, a second embodiment of the invention will be described with reference to FIG. 5. Parts similar to those described with reference to FIG. 2 are identified by the same reference numerals. A p$^+$ floating region 22 having the impurity concentration similar to the p$^+$ guard ring region 13 is formed in the n epitaxial layer 12 so as to be adjacent to the p$^+$ guard ring region 13. It is formed so as to surround the p$^+$ guard ring region 13. The p$^+$ floating region 22 may be doubly or triply provided to obtain a higher breakdown voltage.

Figure 6:
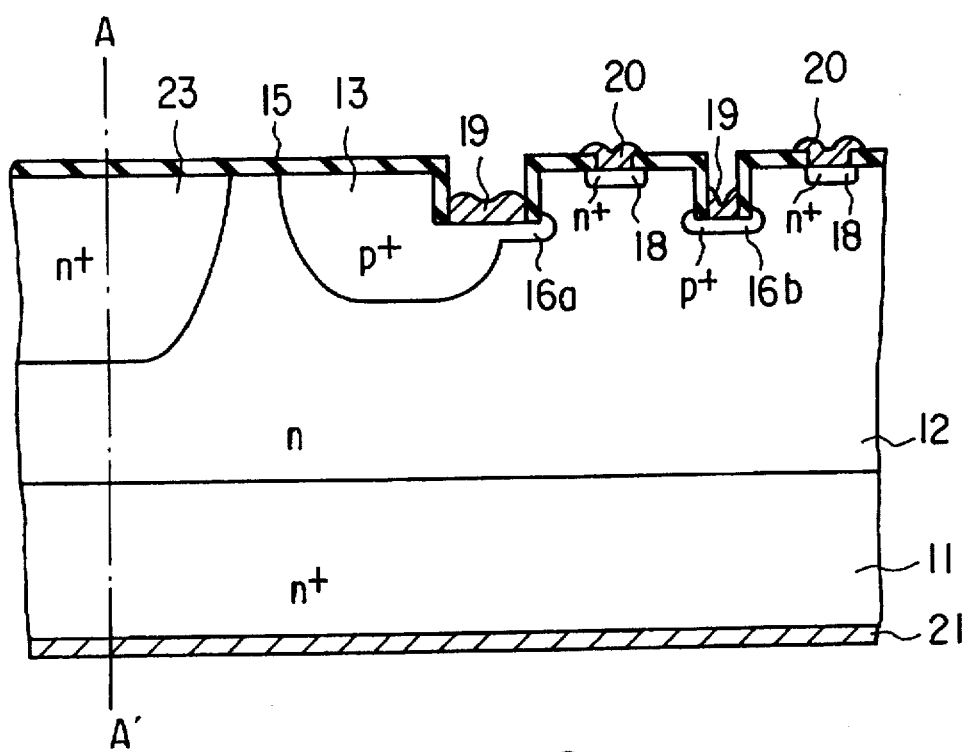
FIG. 6 is a sectional view schematically showing a third embodiment of the SIT according to the invention.

FIG. 6 shows a third embodiment of the invention, wherein an n$^+$ region 23 is disposed around the p$^+$ guard ring region 13. It prevents a depletion layer extended from the p$^+$ guard ring region 13 from excessive extension and is also used as a dicing region along a line along A–A'. According to the n$^+$ region 23, unwanted generation and increase of leakage current can be prevented when the wafer is diced. Preferably, the diffusion depth of the n$^+$ region 23 is at least deeper than the p$^+$ guard ring region 13 and may reach the n$^+$ drain region 11. The p$^+$ floating region 22 may be disposed around the p$^+$ guard ring region 13, around which the n$^+$ region 23 may be provided.

A method of making an SIT according to the invention will be described with reference to FIGS. 7 to 12, which show cross sections taken along line II–II' in FIG. 1 (B).

Figure 7:
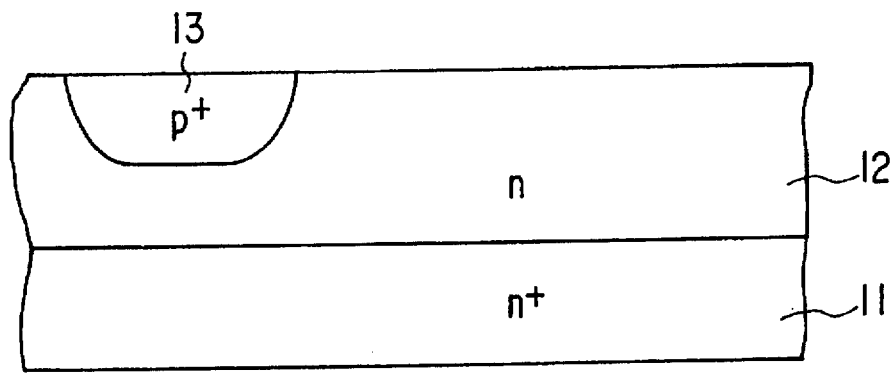
FIGS. 7 to 12 are sectional views showing processes for making the SIT according to the invention.

First, an n$^+$ substrate 11 which becomes a drain region having a (100) or (111) plane having an impurity concentration of about 1×10$^{18}$ to 1×10$^{19}$ cm$^{−3}$, which will be hereinafter referred to as n$^+$ drain region, is prepared. A high-resistance n-type epitaxial layer 12 grown by a vapor phase growth method using SiCl$_4$ and H$_2$ is formed over the n$^+$ drain region 11. The impurity concentration of the n epitaxial layer 12 is 1×10$^{13}$ cm$^{−3}$ or less or 1×10$^{13}$ to 1×10$^{15}$ cm$^{−3}$. For obtaining a just pinch-off characteristic, the impurity concentration of the lower portion of the n epitaxial layer 12 adjacent to the substrate 11 is given by 1×10$^{13}$ cm$^{−3}$, and the impurity concentration of the upper portion, given by 2–3 μm in thickness from the surface, of the n epitaxial layer 12 is given by 5×10$^{14}$ to 1×10$^{15}$ cm$^{−3}$. The n epitaxial layer 12 may have uniform or non-uniform impurity concentration distribution according to design. Thereafter, a p⁺ guard ring region 13 having a surface impurity concentration of $1\times10^{17}$ to $1\times10^{20}$ cm$^{-3}$ is formed in the n epitaxial layer 12 by an ion implantation method, etc., using SiO$_2$, etc., (not shown) as a mask (FIG. 7).

Figure 8:
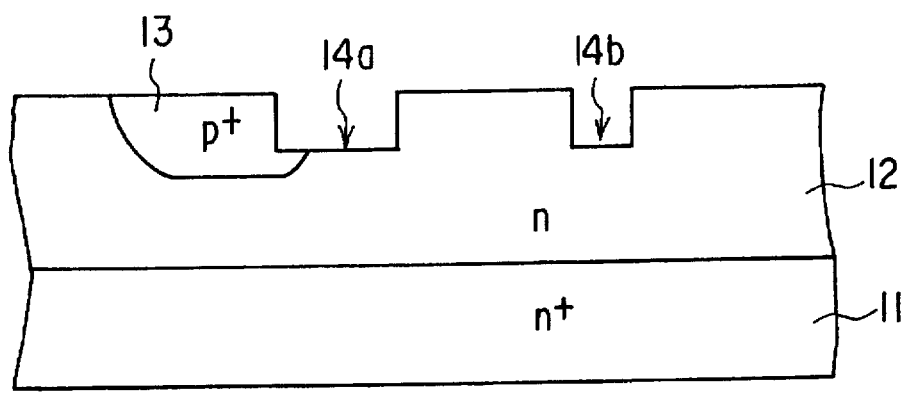

Next, a plurality of elongated grooves 14a and 14b which become recess gates, are formed in the n epitaxial layer 12 by an RIE (reactive ion etching) method, using an SiO$_2$-film, etc., (not shown) as a mask. The outermost groove 14a is formed so as to overlap partially the p⁺ guard ring region 13 in the longitudinal direction, and the groove 14b is formed so as to overlap the p⁺ guard ring region 13 at both edges (not shown). The grooves 14a and 14b are 2 μm and 1 μm wide respectively and 1–1.5 μm deep. The groove 14a may be spaced apart from the groove 14b by 3–7 μm. The RIE uses a mixed plasma of SF$_6$ and O$_2$ gases (FIG. 8).

Figure 9:
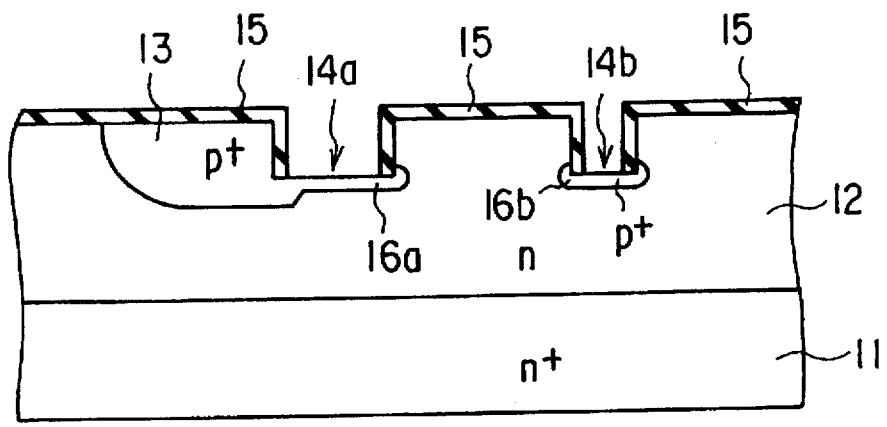

Thereafter, an insulating film 15, such as a thick oxide film having a thickness of about 0.5–1 μm, is formed by oxidizing the n epitaxial layer 12 in water vapor. The insulating film 15 is selectively etched to expose the n epitaxial layer 12 from the bottoms of the grooves 14a and 14b by RIE using CF$_4$ or a mixed gas of CF$_4$ and CHF$_3$. Subsequently, the exposed bottoms of grooves 14a and 14b are subjected to a boron diffusion or ion implantation to provide p⁺ gate regions 16a and 16b having an impurity concentration of $1\times10^{18}$ to $1\times10^{20}$ cm$^{-3}$. In this process, the p⁺ gate region 16a are connected to the p⁺ guard ring region 13. Likewise, the p⁺ gate region 16b is also connected at both edges (not shown) to the p⁺ guard ring region 13. The diffusion depth of the p⁺ gate regions 16 is about 0.5 μm (FIG. 9).

Figure 10:
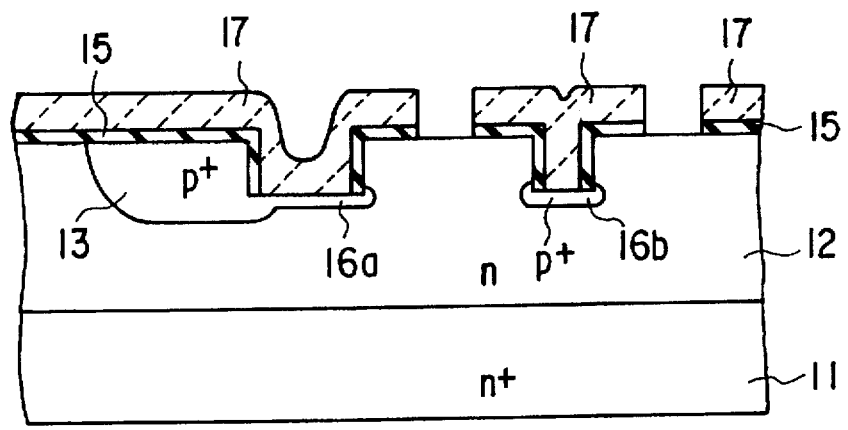
Figure 11:
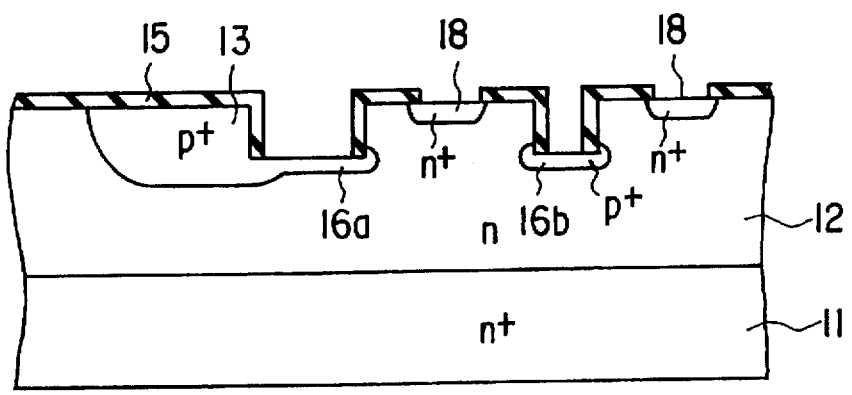
Figure 12:
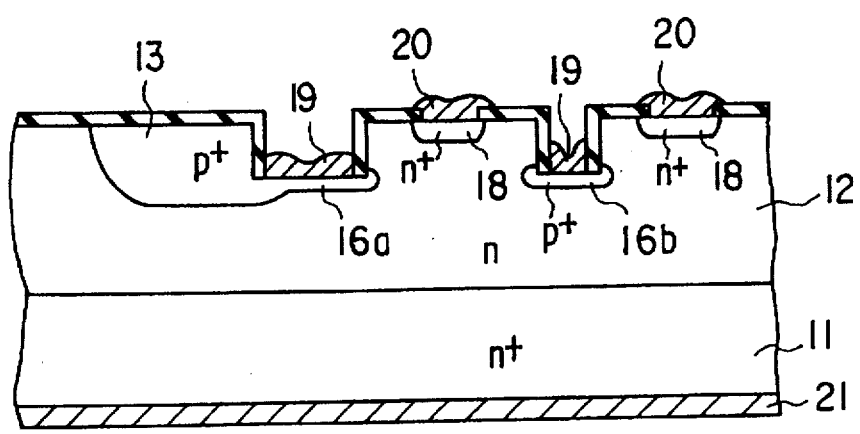

Next, a mask pattern 17 of a resist material, etc., is formed on the substrate surface, and the insulating film 15 is selectively removed by the RIE method, etc., to expose the n epitaxial layer 12 (FIG. 10). Phosphorus or arsenic is ion-implanted into the exposed n epitaxial layer 12 to provide n⁺ source regions 18 therein. Thereafter, the mask pattern 17 is removed. If SiO$_2$, etc., is used as the mask pattern 17, the n⁺ source regions 18 can also be formed by diffusion from a polysilicon layer containing an n-type impurity (FIG. 11). Thereafter, gate electrodes 19, source electrodes 20, and a drain electrode 21 are formed in the p⁺ gate regions 16, the n⁺ source regions 18, and the n⁺ drain region 11, respectively, (FIG. 12).

Next, a fourth embodiment of the invention will be described with reference to FIGS. 13–17.

Figure 13:
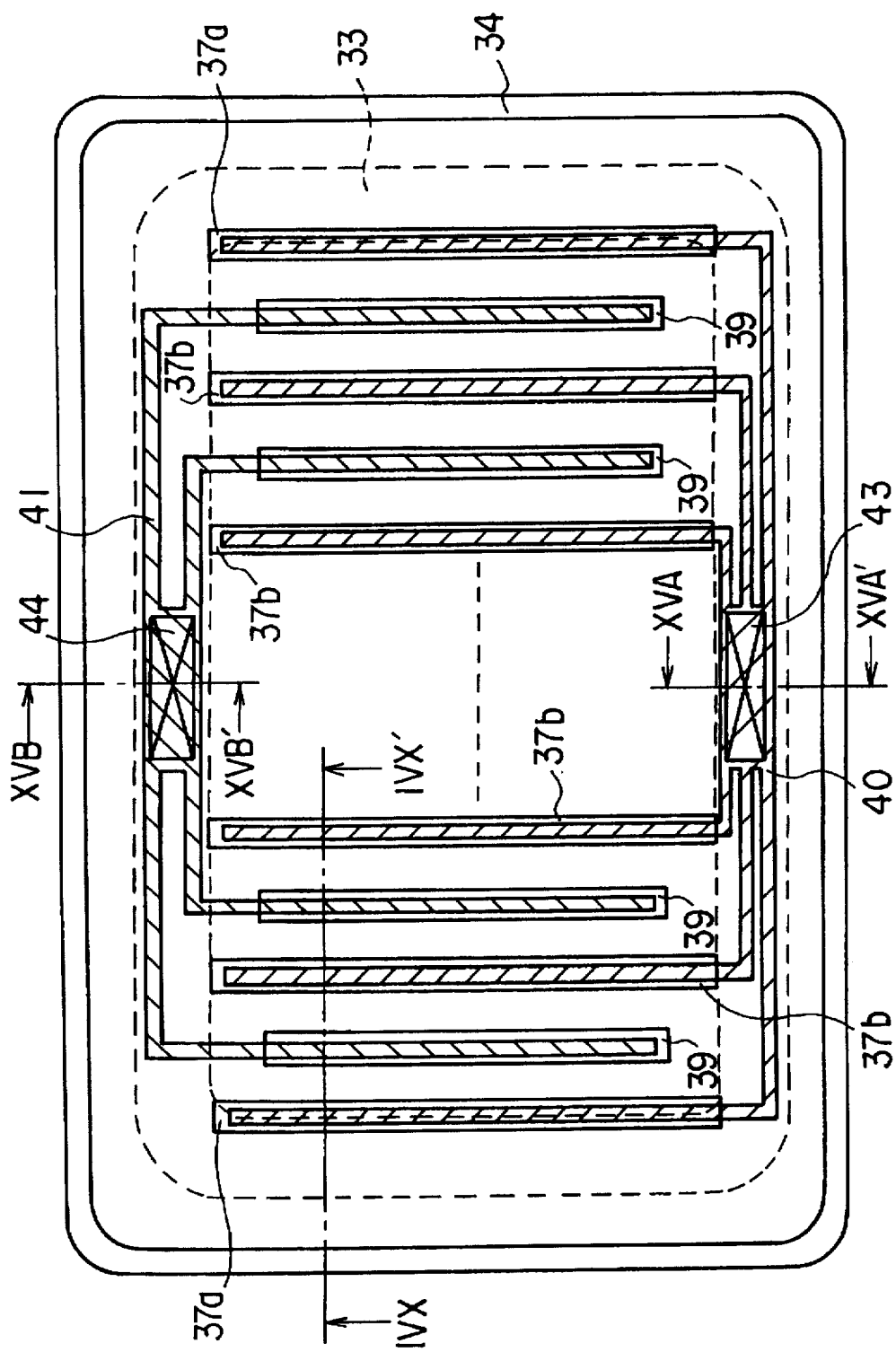
FIG. 13 a plan view schematically showing a fourth embodiment of the SIT according to the invention.

As shown in FIG. 13, a recess gate type SIT comprises a plurality of elongated p⁺ gate regions 37 (containing 37a and 37b), a plurality of elongated n⁺ source regions 39, a rectangular p⁺ guard ring region 33 disposed so as to surround the p⁺ gate regions 37 (enclosed with a broken line in the figure), a p⁺ floating region 34 located in the outer periphery of the p⁺ guard ring region 33, gate electrode wiring layers 40 provided on the p⁺ gate regions 37 and connected to one another above the p⁺ guard ring region 33, source electrode wiring layers 41 provided on the n⁺ source regions 39 and connected to one another above the p⁺ guard ring region 33, a gate contact pad (bonding pad) 43 connected to the gate electrode wiring layers 40, and a source contact pad (bonding pad) 44 connected to the source electrode wiring layers 41. In this case, the gate and source contact pads 43 and 44 are disposed above the p⁺ ring region 33.

As is apparent from FIG. 13, left-upward oblique lines are indicatively drawn in the gate electrode wiring layers 40, and right-upward oblique lines are drawn in the source electrode wiring layers 41. For example, boron-doped polysilicon is used as the gate and source electrode wiring layers 40 and 41, and metals such as Al or Al-Si are used as the gate and source contact pads 43 and 44.

The p⁺ gate regions 37 and the n⁺ source regions 39 are disposed so as to be alternately in parallel. The p⁺ gate region 37a disposed on the outermost side is connected to the p⁺ guard ring region 33 in a longitudinal direction, and each p⁺ gate region 37b sandwiched between the n⁺ source regions 39 is connected at both edges to the p⁺ guard ring region 33. The corners of the p⁺ guard ring region 33 are rounded to relieve an electric field intensity. The p⁺ gate regions 37 and the n⁺ source regions 39 are disposed to be perpendicular to the opposed long sides of the p⁺ guard ring region 33 and to be symmetric with respect to the center line of the gate and source contact pads 43 and 44. The gate and source electrode wiring layers 40 and 41 have an interdigital electrode structure.

Figure 14:
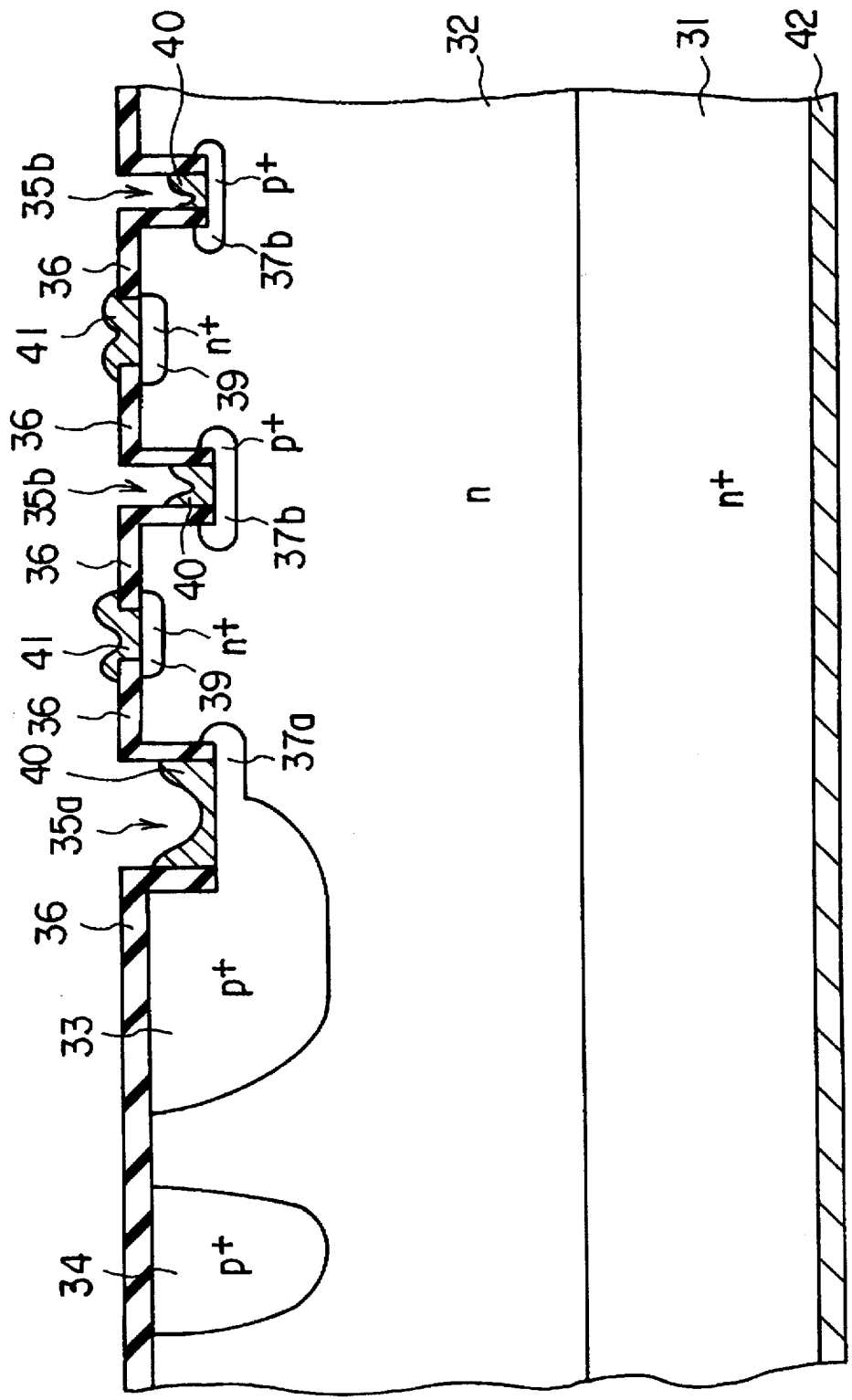
FIG. 14 is a sectional view of FIG. 13 taken along a line IVX–IVX'.

The cross section of the recess gate type SIT will be described with reference to FIG. 14, which is a sectional view taken along a line IVX–IVX' in FIG. 13. The recess gate type SIT includes an n⁺ drain region (n⁺ substrate) 31, an n epitaxial layer 32, which is a high-resistance channel region provided over the n⁺ drain region 31, grooves 35a and 35b formed in the n epitaxial layer 32, an insulating film 36 formed on the n epitaxial layer 32, p⁺ gate regions 37a and 37b formed on the n epitaxial layer 32 from the bottoms of the grooves 35a and 35b, a p⁺ guard ring region 33 formed in the n epitaxial layer 32 so as to be connected to the outer peripheral portion of the p⁺ gate region 37 in a longitudinal direction, a p⁺ floating region 34 formed in the n epitaxial layer 32, n⁺ source regions 39 provided on the n epitaxial layer 32, gate and source electrode wiring layers 40 and 41 disposed on the p⁺ gate regions 37 and the n⁺ source regions 39, respectively, and a drain electrode 42 provided over the n⁺ drain region 31. An SiO$_2$ film, an SiN film, a PSG film, a polyimide film, or these composite films can be used as the insulating film 36.

Figure 15A:
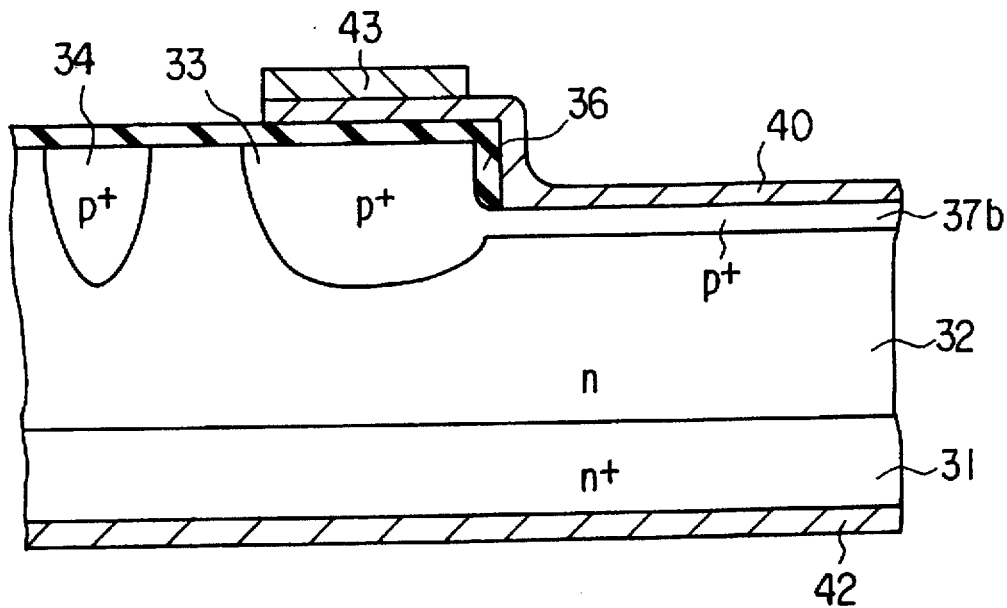
FIG. 15A is a sectional view of FIG. 13 taken along a line XVA–XVA'.
Figure 15B:
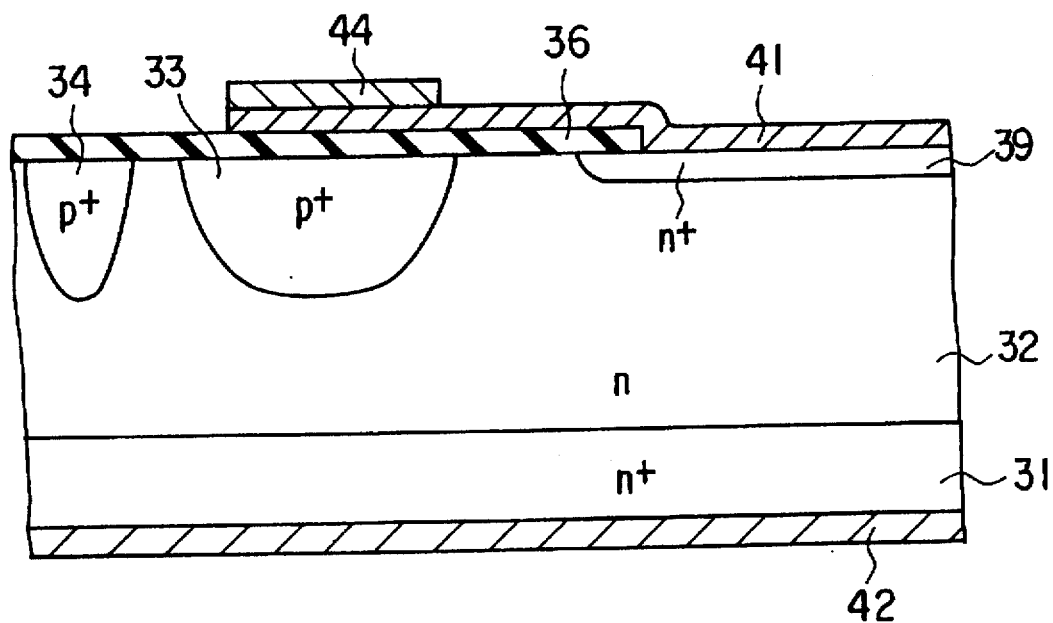
FIG. 15B is a sectional view of FIG. 13 taken along a line XVB–XVB'.

As shown in FIG. 15 (A), the p⁺ gate region 37b and the p⁺ guard ring region 33 are connected to each other. Each of gate electrode wiring layers 40 is provided on the p⁺ gate region 37b and extends to the p⁺ guard ring region 33 by the insulating film 36, and the gate contact pad 43 is provided on the gate electrode wiring layer 40 above the p⁺ guard ring region 33. As shown in FIG. 15 (B), each of the source electrode wiring layers 41 is provided on the n⁺ source region 39 and extends to the p⁺ guard ring region 33 by the insulating film 36, and the source contact pad 44 is formed on the source electrode wiring layer 41 above the p⁺ guard ring region 33.

Figure 16A:
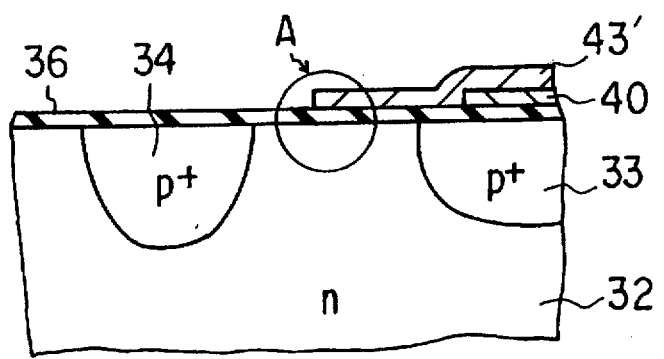
FIG. 16A is a partial sectional view when a pad extends to a surface of a channel region.
Figure 16B:
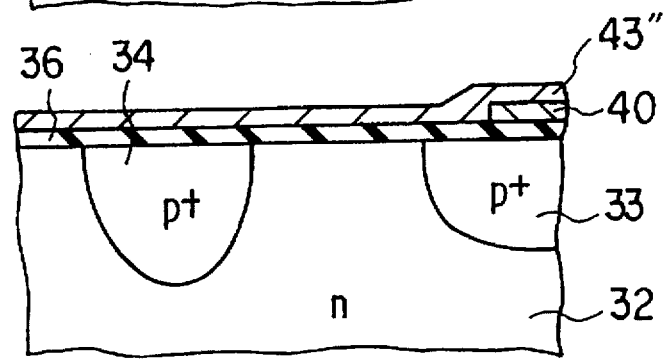
FIG. 16B is a partial sectional view when a pad extends to a floating region.

As described above, the gate and source contact pads 43 and 44 are disposed only on the p⁺ guard ring region 33. As shown in FIG. 16 (A), if a gate electrode pad 43' extends to a portion between the p⁺ guard ring region 33 and the p⁺ floating region 34, the breakdown voltage is lowered at the circular portion A. As shown in FIG. 16 (B), if a pad 43" reaches or exceeds the p⁺ floating region 34, the gate-to-drain breakdown voltage $BV_{gd}$ is decreased and the gate-to-drain capacitance $C_{gd}$ is increased, thereby decreasing the power gain at high-frequency region. In addition, a parasitic MOS transistor comprised of the p⁺ guard ring region 33, the n epitaxial layer 32 and the p⁺ floating region 34 is produced. Therefore, if the gate-to-drain breakdown voltage $BV_{gd}$ is, for example, about 600 V, it is reduced to about 300 V with time. Therefore, it is necessary to provide the gate and source contact pads 43 and 44 only on the p⁺ guard ring region 33.

Further, since the outermost peripheral portion of the p⁺ gate region 37a is connected to the p⁺ guard ring region 33 along the longitudinal direction, and the gate-to-drain breakdown voltage $BV_{gd}$ is determined by the flat junction portion of the p⁺ gate region 37, $BV_{gd}$ can be enhanced to almost the theoretical breakdown voltage. However, if the gate and source contact pads 43 and 44 are located outside the p⁺ guard ring region 33, the breakdown voltage will be lowered, as described above. Therefore, for intending the breakdown voltage of SITs to become high, the p⁺ guard ring region 33 is provided and the gate and source contact pads 43 and 44 are disposed only on the p⁺ guard ring region 33.

For example, when the n epitaxial layer 32 was 35–55 μm thick, the grooves 35 were 1–1.5 μm deep and spaced apart by 7–10 μm from each other, the p⁺ guard ring region 33 was 30–50 μm wide at the mask level, and the diffusion depth of the p⁺ guard ring region 33 was about 5 μm, the recess gate type SIT having the gate-to-drain breakdown voltage $BV_{gd}$ of about 300–600 V and the power gain of 20–25 dB at 10 MHz and 10–15 dB at 100 MHz could be obtained.

Figure 17:
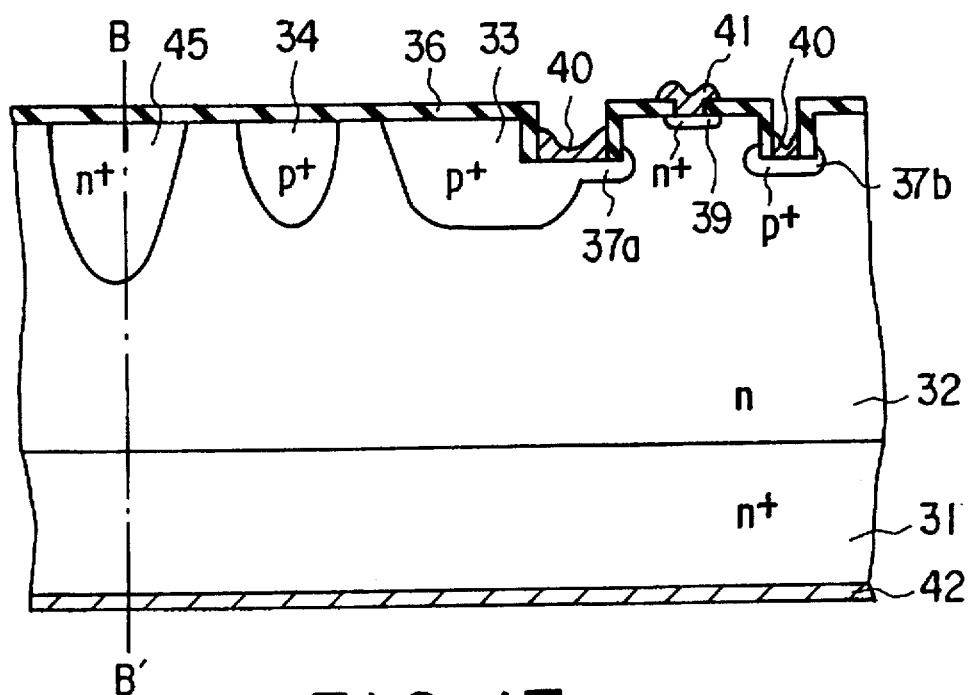
FIG. 17 is a sectional view of the SIT having an $n^+$ region serving as a dicing region.

Further, as shown in FIG. 17, an n⁺ region 45 may be provided at the outer periphery of the p⁺ floating region 34. When the wafer is diced along a line B–B', generation and increase of leakage current can be prevented. It is preferable that the diffusion depth of the n⁺ region is at least deeper than the p⁺ guard ring region 33.

Next, a fifth embodiment of the invention will be described.

Figure 18:
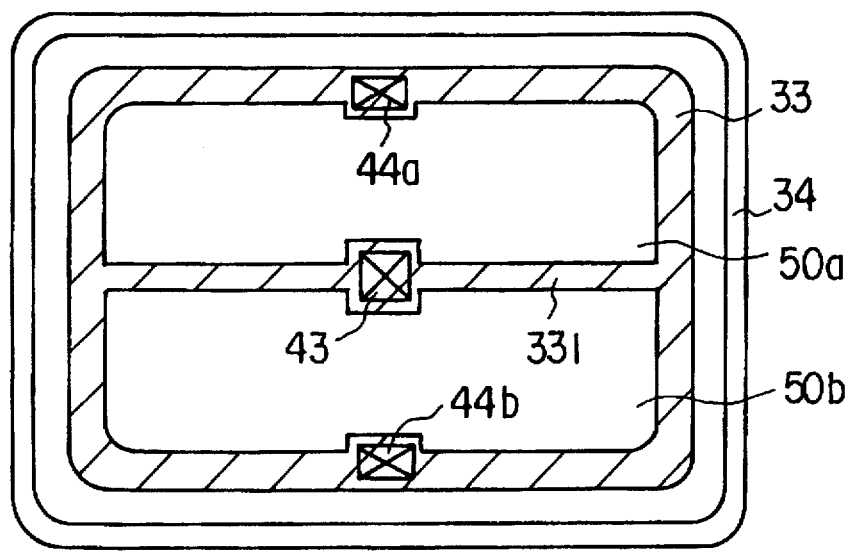
FIG. 18 is a plan view schematically showing a fifth embodiment of the SIT having two element regions according to the invention.

FIG. 18 shows an SIT which includes two unit cells 50a and 50b connected in parallel, each having gate and source regions, etc. in the same manner as FIG. 13. The details of the unit cells 50a and 50b in FIG. 18 are similar to those in FIG. 13 and are omitted. A p⁺ guard ring region 33 is continuously provided so as to define rectangular unit cells 50a and 50b, and a p⁺ guard ring region 331 connected to both ends of the gate region is formed between the unit cells 50a and 50b.

A source contact pad 44a of the unit cell 50a and a source electrode pad 44b of the unit cell 50b are provided almost at the center of both the outer long sides of the p⁺ guard ring region 33. A gate contact pad 43, which is connected to the gate regions of the unit cells 50a and 50b so as to align with the source contact pads 44a and 44b, is disposed on the common p⁺ guard ring region 331. As in FIG. 13, in each unit cell, the p⁺ gate regions and the n⁺ source regions are perpendicular to the opposed long sides of the p⁺ guard ring region 33 and are symmetric with respect to the center line of the gate and source contact pads 43, 44a, and 44b. Areas of the p⁺ guard ring region 33 for disposing the gate and source contact pads 43, 44a, and 44b is increased as compared with other portions thereof.

Figure 19:
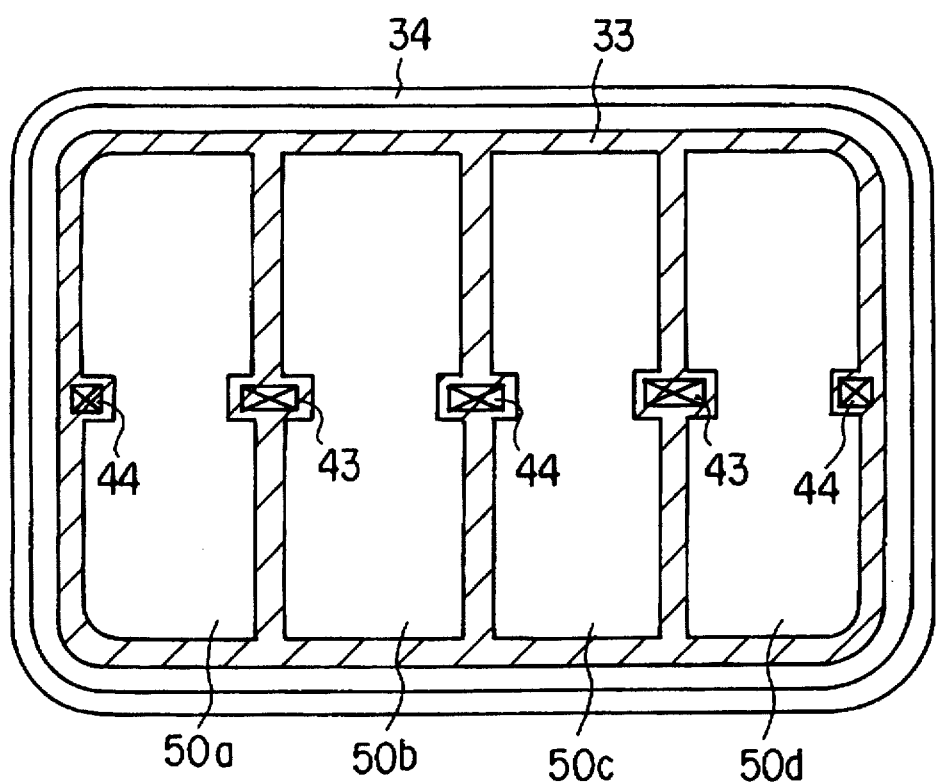
FIG. 19 is a plan view schematically showing the SIT having four element regions.
Figure 20A:
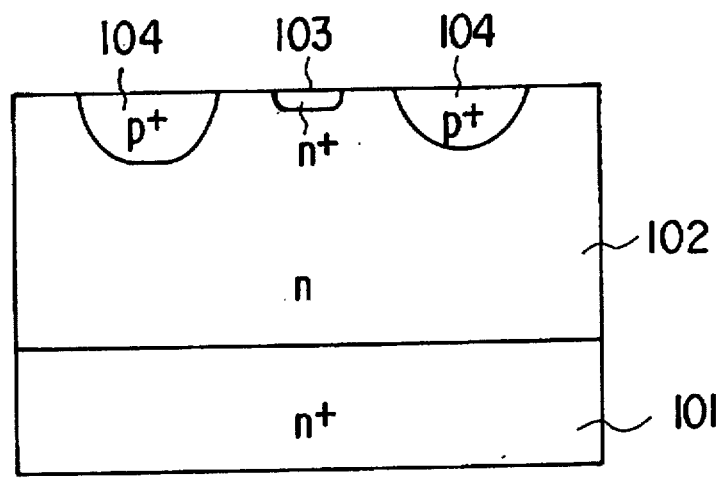
FIGS. 20A to C are sectional views schematically showing known SITs.
Figure 20B:
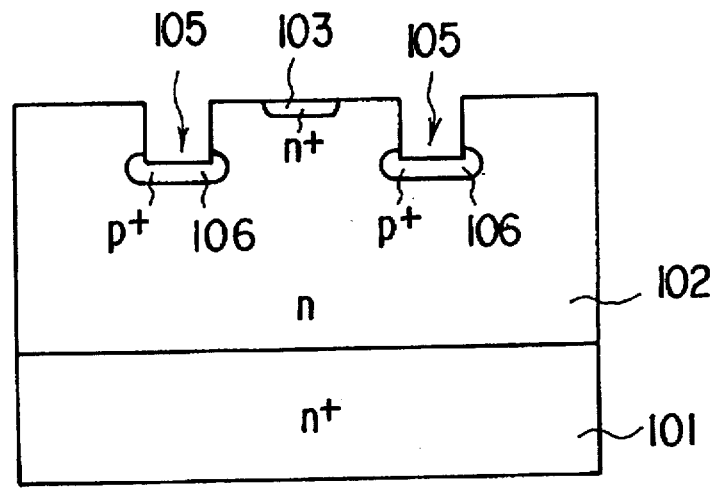
Figure 20C:
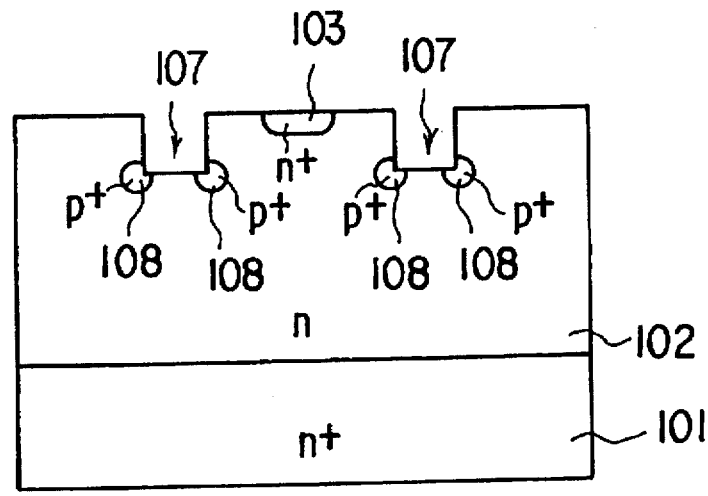
Figure 21A:
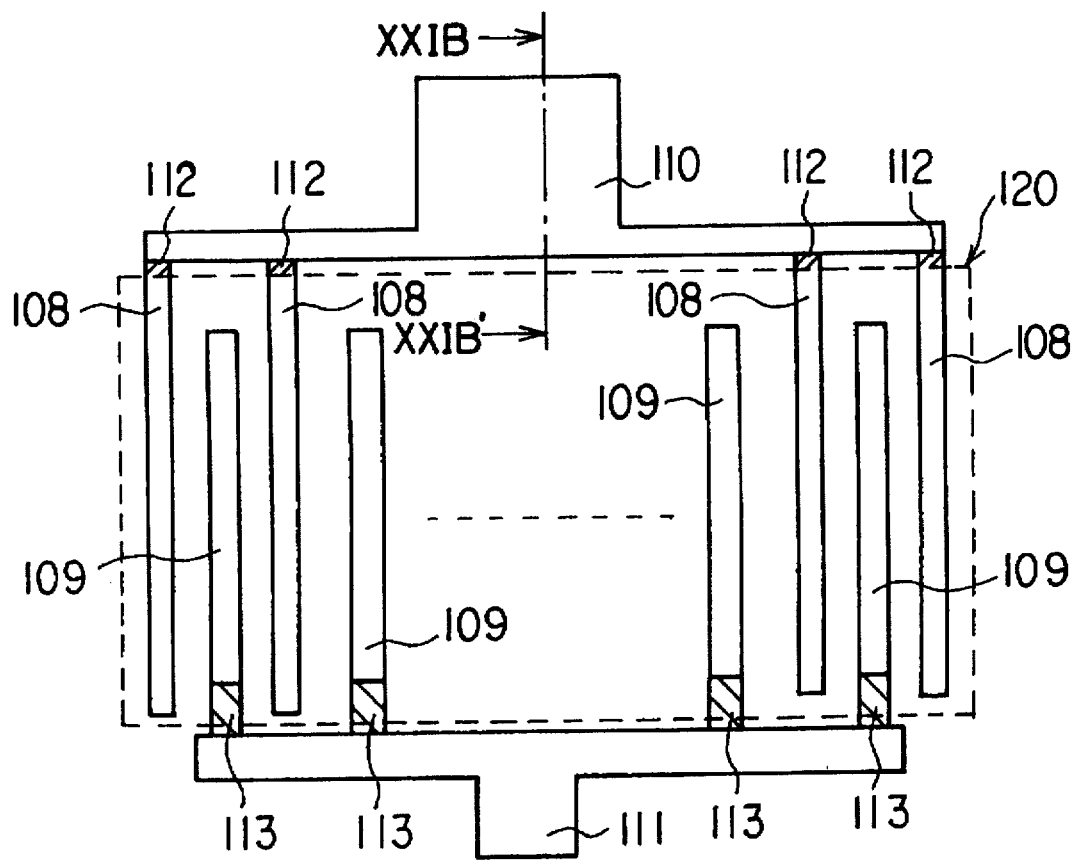
FIG. 21A is a plan view schematically showing known SIT.
Figure 21B:
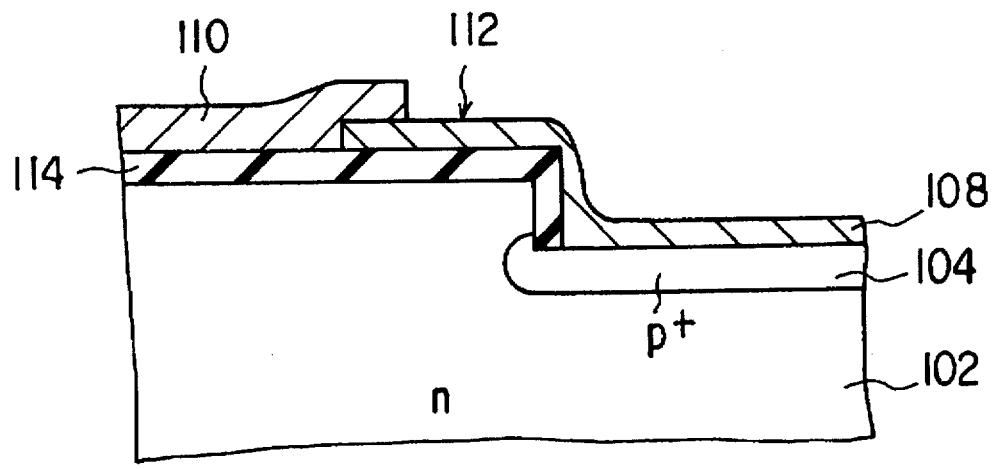
FIG. 21B is a sectional view of FIG. 21(A) taken along a line XXI–XXI'.

FIG. 19 shows an SIT including four unit cells 50a–50d connected in parallel. Also in this case, as in FIG. 18, a rectangular p⁺ guard ring region 33 is provided so as to define unit cells 50a–50d. Source contact pads 44 and gate contact pads 43 are alternately disposed only on the p⁺ guard ring region 33.

Thus, a large number of unit cells 50 can be easily connected in parallel by disposing the gate and source contact pads 43 and 44 on the p⁺ guard ring regions 33 having common portion. Considering the current capacity and resistance, etc., two or more contact pads may be disposed at each guard ring region. The p⁺ guard ring region 33 below the contact pads may have a desired configuration. Since the channel has high resistance, the digestion is easily produced within the unit cell.

The effect of source and gate inductances cannot be neglected when the SITs are used at the VHF or UHF bands, which are of higher frequency than the HF band. However, a device including several small-area unit cells 50 connected in parallel can reduce unwanted inductance as compared with the device structure with only one large-area cell. Further such a device can be operated uniformly.

The devices shown in the fourth and fifth embodiments can also be manufactured by processes similar to that shown in FIGS. 7–12.

Although the recess gate type SITs have been described, a similar description applies to side gate type SITs. The invention can be applied not only to SITs made of Si, but also compound semiconductors made of GaAs, InP, etc., needless to say.

According to the invention, in the recess or side gate type SIT, a guard ring region is provided at the periphery of the gate region, thereby increasing remarkably a high gate-drain junction breakdown voltage. For the SITs of the invention, the voltage that can be applied between the drain and the source becomes double or more without degrading the high-frequency characteristics as compared with the conventional SITs, and a high-output power SIT can be provided. A p⁺ guard ring region is provided so as to be coupled to the outermost peripheral portion of the p⁺ gate regions, and gate and source contact pads are disposed only on the p⁺ guard ring region, whereby the breakdown voltage can be improved and SITs having good high-frequency characteristics can be provided. Further, it is easy to provide the parallel connection of small-area unit cells, thereby increasing the total source length and reducing the inductance.

It is further understood by those skilled in the art that the foregoing description is a preferred embodiment of the disclosed device and that various changes and modifications may be made in the invention without departing from the spirit and scope thereof.

What is claimed is:

1. A static induction transistor comprising:
   a drain region having a first conductivity type;
   a channel region, provided over said drain region, having said first conductivity type;
   a plurality of grooves each being formed in said channel region;
   a plurality of source regions having said first conductivity type, each being provided in said channel region so as to be disposed among said plurality of grooves;
   a plurality of gate regions having a second conductivity type, each being provided on a bottom of said grooves, wherein said plurality of gate regions and said plurality of source regions being arranged in parallel to one another; and
   a guard ring region, having said second conductivity type, provided in said channel region, said guard ring region being arranged to surround said plurality of gate regions so that outer-most gate regions in said plurality of gate regions overlap one side of said guard ring region, respectively and each of said plurality of gate regions is coupled to said guard ring region at both edges thereof.

2. The static induction transistor according to claim 1, wherein a width of said guard ring is equal to or slightly longer than a distance between each of said plurality of gate regions and said drain region.

3. The static induction transistor according to claim 1, wherein a floating region having said second conductivity type is provided in said channel region so as to surround said guard ring region.

4. The static induction transistor according to claim 1, wherein a semiconductor region having said first conductivity type is arranged in said channel region to surround said guard ring region.

5. The static induction transistor according to claim 4, wherein said semiconductor region is used as a dicing region.

6. The static induction transistor according to claim 1, wherein source and gate electrodes having an interdigital structure are provided on said channel region by an insulating film.

7. A static induction transistor comprising:

a drain region having a first conductivity type;

a channel region, provided over said drain region, having said first conductivity type;

a plurality of grooves each being formed in said channel region and having a bottom;

a plurality of source regions having said first conductivity type, each being provided on said channel region so as to be disposed between said plurality of grooves, wherein said plurality of grooves and said plurality of source regions being arranged in parallel to one another;

a plurality of gate regions having a second conductivity type, each being provided in said bottom;

a guard ring region, provided in said channel region, having said second conductivity type, said guard ring region being arranged to surround said plurality of gate regions so that outer-most gate regions in said plurality of gate regions overlap one side of said guard ring region, respectively, and that each of said plurality of gate regions is coupled to said plurality of gate regions at both edges thereof;

source electrodes each being provided on each of said plurality of source regions;

gate electrodes each being provided on each of said plurality of gate regions; and first and second contact pads provided on said guard ring region by an insulating film and connected to said source electrodes and to said gate electrodes, respectively.

8. The static induction transistor according to claim 7, wherein each of said plurality of source regions and each of said plurality of gate regions are alternately arranged to one another.

9. The static induction transistor according to claim 7, wherein said first and second contact pads are disposed so as to be opposed to each other.

10. The static induction transistor according to claim 7, wherein said plurality of gate regions and said plurality of source regions are symmetric with respect to a straight line connecting centers of said first and second contact pads.

11. A static induction transistor comprising:

a drain region having a first conductivity type;

a channel region, provided over said drain region, having said first conductivity type;

a guard ring region having a second conductivity type, said guard ring region being provided in said channel region to define first and second regions separated by a common portion of said guard ring region; a plurality of grooves each being formed in said each of said first and second regions and having a bottom;

a plurality of source regions having said first conductivity type, each being provided on said each of said first and second regions so as to be disposed between said plurality of grooves, wherein said plurality of grooves and said plurality of source regions being arranged in parallel to one another;

a plurality of gate regions having a second conductivity type, each being provided in said bottom;

source electrodes each being provided on each of said plurality of source regions;

gate electrodes each being provided on each of said plurality of gate regions;

first and second contact pads provided on said guard ring region by an insulating film and connected to said source electrodes; and a third contact pad provided on said common portion of said guard ring region by said insulating film and connected to said gate electrodes.

12. The static induction transistor according to claim 11, wherein said first, second and third contact pads are aligned.

13. The static induction transistor according to claim 11, wherein said plurality of source regions and said plurality of gate regions are perpendicular to one side of said guard ring region.

14. The static induction transistor according to claim 11, wherein said first and second regions are symmetric with respect to said common portion of said guard ring region.

* * * * *